United States Patent [19]

Jung

[11] Patent Number: 5,402,123
[45] Date of Patent: Mar. 28, 1995

[54] VARIABLE LENGTH CODING/DECODING METHOD OF IMAGE DATA AND APPARATUS THEREOF

[75] Inventor: Je-Chang Jung, Seoul, Rep. of Korea

[73] Assignee: Samsung Electronics Co., Ltd., Kyungki-do, Rep. of Korea

[21] Appl. No.: 69,914

[22] Filed: Jun. 1, 1993

[30] Foreign Application Priority Data

May 30, 1992 [KR] Rep. of Korea ............ 92-9397

[51] Int. Cl.⁶ ............................................ H03M 7/46
[52] U.S. Cl. .................................... 341/63; 341/65
[58] Field of Search ................ 341/50, 63, 65, 67

[56] References Cited

U.S. PATENT DOCUMENTS

| | | | |
|---|---|---|---|
| 4,121,259 | 10/1978 | Preuss et al. | 358/261 |
| 4,626,829 | 12/1986 | Hauck | 341/63 |
| 4,646,061 | 2/1987 | Bledsoe | 341/65 |
| 4,819,079 | 4/1989 | Takao | 358/260 |
| 5,140,322 | 8/1992 | Sakagami | 341/65 |
| 5,289,190 | 2/1994 | Shimoda et al. | 341/50 |

*Primary Examiner*—Marc S. Hoff
*Attorney, Agent, or Firm*—Sughrue, Mion, Zinn, Macpeak & Seas

[57] ABSTRACT

A method of variable length coding/decoding of image data and an apparatus thereof can vary the length of an escape sequence during variable length coding to thereby reduce the amount of transmitted data.

The method of variable length coding/decoding includes the steps of loading an initial potential maximum run length; determining a number of bits necessary to express the potential maximum run length; coding a run length using the necessary number of bits and decreasing the potential maximum run length by an amount equal to the previously coded run length to arrive at a new potential maximum run length until an end of a block to be encoded has been reached.

7 Claims, 8 Drawing Sheets

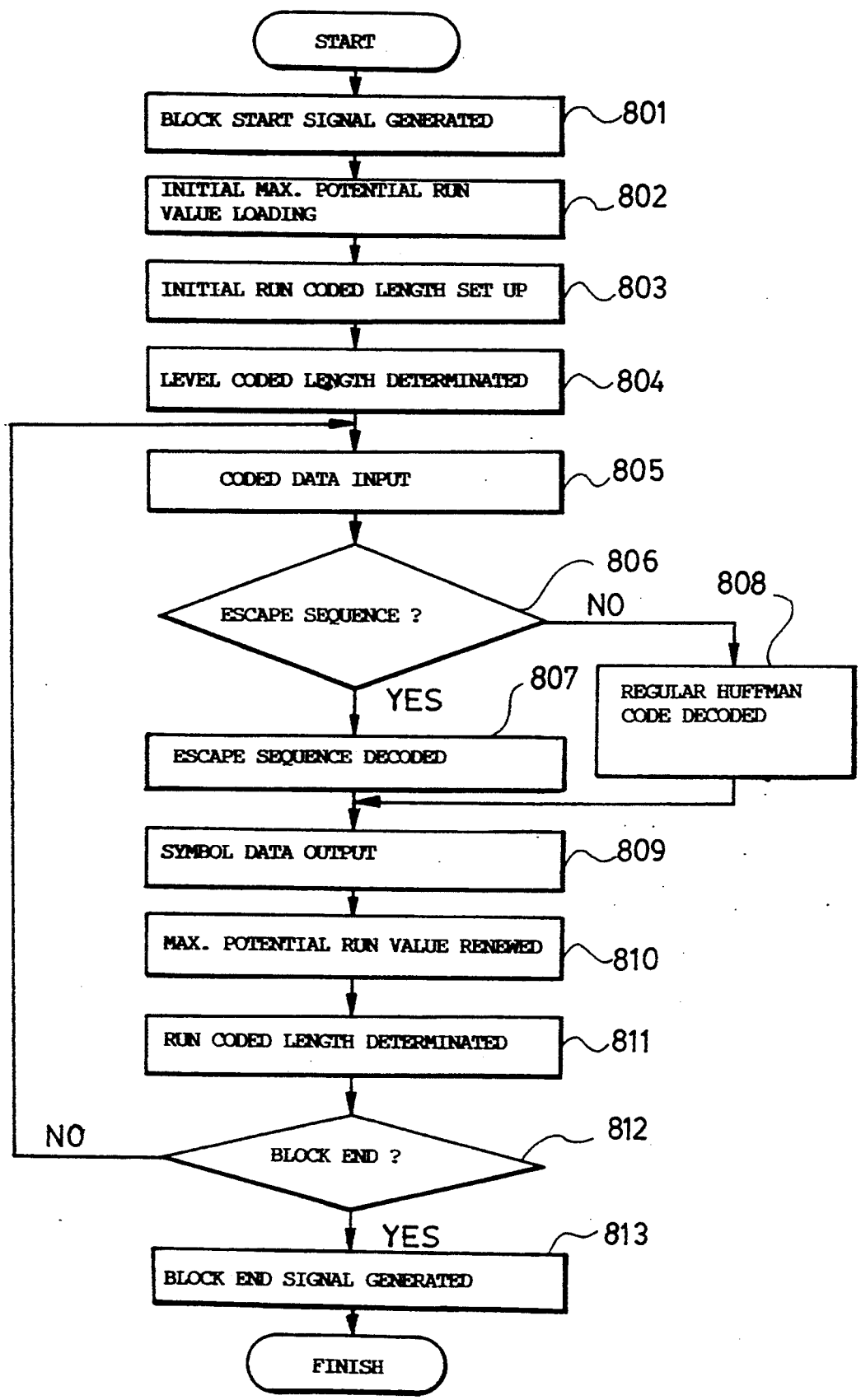

VARIABLE LENGTH CODING/DECODING METHOD OF IMAGE DATA AND APPARATUS THEREOF

BACKGROUND OF THE INVENTION

1. Field of the Invention

The present invention relates to a coding and decoding method of a digital image data and an apparatus thereof, and more particularly to a variable length coding/decoding method of an image data and an apparatus thereof which can vary the length of an escape sequence during a variable length coding to thereby reduce the amount of a transmitting data to transmit and similarly to thereafter reduce the amount of received data to decode.

2. Description of the Prior Art

Recently, in order to improve picture quality, a method has become popular an image in which signal is coded and processed by digital data.

However, when an image signal is digitally encoded, the amount of data become voluminous.

Therefore, encoding transformations such as Differential Pulse Code Modulation DPCM, vector quantization, Variable Length Coding and the like are performed in order to reduce the large amount of data by removing redundant data contained in the digital image signal.

FIG.1 is a block diagram for schematically illustrating a conventional digital signal coding apparatus, the apparatus comprising the means for: performing a transform by Discrete Cosine Transform DCT method on an N×N block to thereby quantize a transform coefficient; performing a variable length coding on quantized data to thereby compress the data amount substantially; and performing an inverse quantization and inverse transform on the quantized data to thereby perform a motion compensation.

In FIG. 1, the image signal is input through an input terminal 10 and is transformed to a signal of a frequency region on an N×N block unit at an N×N transform unit 11 and an energy of coefficient thus transformed is mainly gathered towards low frequency components.

A data transformation is performed on each block by methods such as a DCT, Walsh-Hadamard Transform WHT, Discrete Fourier Transform DFT, Discrete Sine Transform and the like.

A quantization unit 12 transforms the transform coefficients to representative values of certain levels through a predetermined quantization process.

A variable length coding unit 13 based on statistical characteristics of the representative values, performs the variable length coding, so that the data can be markedly compressed.

Meanwhile, in accordance with a state of a buffer 14 where a variable-length-coded data is stored, a transformed quantization step size Qss controls the quantization unit to thereby adjust a transmission bit ratio. The quantization step size Qss can be transmitted to a receiving end to thereby be utilized by a decoding apparatus.

Furtheremore, because there are usually many similarities between portions of screens, and in the case of a screen containing motion, the motion is estimated to thereby calculate a vector thereof, and if a data is compensated by utilizing the vector, and because a difference signal between neighboring screens is very small, the transmission data can be substantially compressed.

In order to perform a motion compensation, an inverse quantization unit 15 and an N×N inverse transform unit 16 in FIG. 1 perform an inverse quantization on the quantized data output from the quantization unit 12 to thereafter inversely transform the same, so that the same can be transformed to an image signal within a spatial region.

The image signal output from the inverse transform unit 16 is stored per frame unit on a frame memory 17 and a motion estimating unit 18 seeks a block pattern most similar to the N×N block data of the input terminal 10 from the frame data stored in the frame memory 17 to thereby calculate a motion vector MV representing a motion between the two blocks.

The motion vector is transmitted to the receiving end to thereby be utilized by a decoding apparatus and at the same time to thereby be transmitted to a motion compensating unit 19.

The motion compensating unit 19 receives the motion vector MV from a motion estimating unit 18 and reads out an N×N block corresponding to the motion vector MV from a prior frame data outputted from the frame memory 17 to thereby supply the same to an adder A1 connected to the input terminal 10.

Then, the adder A1 calculates a difference between an N×N block supplied to the input terminal 10 and an N×N block of similar pattern supplied from the motion compensating unit 19, and the output data of the adder A1 is coded to thereby be transmitted to the receiving end.

In other words, at first, the whole image signals are transmitted and then only a difference signal corresponding to the motion, is transmitted.

Meanwhile, the data whose motion has been compensated at the motion compensating unit 19 is added together with the image signal output to the N×N inverse transform unit 16 by an adder A2 and this sum is stored on the frame memory 17.

A refresh switch (not shown) is occasionally rendered off by a control means, and because the input image signal is coded by Pulse-Count Modulation PCM mode to thereby be transmitted, only the difference signal is coded, so that an accumulation of codes resulting from the transmission can be refreshed after a predetermined time interval and a transmission error on a channel can be removed at the receiving end within a predetermined period of time.

In this manner, the coded image data is transmitted to the receiving end to thereby be input to the decoding apparatus as indicated in FIG. 2.

The coded image data is decoded at a variable length decoding unit 21 via an inverse coding process.

The data input from the variable length decoding unit 21 is inversely quantized at an inverse quantization unit 22.

Within the inverse quantization unit 22, the magnitude of an output transform coefficient is adjusted by the quantization step size Qss supplied from the coding apparatus.

An N×N inverse transform unit 23 transforms a frequency region transform coefficient supplied from the inverse quantization unit 22 into image data within a spatial region.

Furthermore, the motion vector MV transmitted from the coding apparatus as illustrated in FIG. 1 is supplied to a motion compensating unit 24 of the decoding apparatus, which reads out an N×N block corresponding to the motion vector MV from a frame data stored on a frame memory 25 to thereafter compensate for the motion and to thereby supply the same to an adder A3.

Then, the adder A3 adds an inversly transformed DPCM data to an N×N block of data supplied from the motion compensating unit 24 to thereby output the same to a display unit.

FIGS. 3A-3C are schematic drawings for illustrating a quantization process of an image data.

A sampling of image data of an N×N block as indicated in FIG. 3A is tranformed to a transform coefficient of a frequency region as illustrated in FIG. 3B by a DCT and the like.

After the transform coefficient is quantized, the same is scanned in a zig-zag pattern as illustrated in FIG. 3C to thereby be coded in a format.

When the N×N block is scanned, a low frequency component is started first as illustrated in FIG. 3C and then a high frequency component is scanned to thereby be coded as a "run" and "level" pair.

Here, the "run" corresponds to a number of "0's" existing among the non-zero quantized coefficients of the N×N block and the "level" corresponds to an absolute value of the coefficients which are not "0".

By way of example, in the case of an 8×8 block, the "run" can have a value ranging from "0" to "63".

The "level" varies according to a data value output from the quantization unit, for example, if a quantization output value is expressed as an integer from "−255" to "+255", the "level" comes to have a value from "1" to "255".

The reference symbols, "+" or "−" are expressed by separate sign bits.

As seen from the foregoing, if is utilized as a symbol, and if the Run is large or Level is large, an occurring frequency of the symbols is very low statistically.

Accordingly, as illustrated in FIG. 4, a regular region and escape region are partitioned according to the occurring frequency of the symbols so that a Huffman code is utilized to thereby code the image data for the regular region where the occurring frequency is relatively high, and the image data is coded utilizing an escape sequence for the symbols in the escape region where the occurring frequency is low.

Here, the Huffman code allocates a short-length code when the occurring frequency of symbol is high and a long-length code is allocated when the occurring frequency of symbol is low.

Furthermore, the escape sequence which has coded a data of escape region comprises an escape code ESC, run, level and sign data respectively having predetermined bits as indicated in the following formula (1)

Escape Sequence=ESC+RUN+L+S    Formula 1

For example, as mentioned in the aforesaid, when the quantized value at the 8×8 block ranges "from −255 to 255", the escape sequence has an escape code data ESC of 6-bit, a run data of 6-bit, a level data L of 8-bit and a sign data RUN S of 1-bit, totalling 21-bit of fixed data length.

In this way, in a conventional variable length coding method, various additional information was transmitted along with coded data, and furtheremore because the escape data has a predetermined fixed length, there has been a limit to coding the transmission data to thereby compress the data amount.

SUMMARY OF THE INVENTION

Accordingly, it is an object of the present invention to provide a variable length coding/decoding method image data and an apparatus thereof which can variably adjust a length of an escape data using a variable length coding method encoding a transmission signal to thereby improve markedly a data compression efficiency.

In accordance with one aspect of the present invention, there is provided a variable length coding/decoding method of an image data, the method comprising the processes of: transforming sampled image data to a transform coefficient of frequency region, quantizing and scanning the same in a predetermined direction, so that symbol data having a "run" and a "level" as a pair can be calculated (first process); coding and transmitting the symbol data calculated from the first process by Huffman code when the data belongs to a regular region, and when the data belongs to an escape region, coding the turn up to the maximum run length in a bit number which can express the run, and coding and transmitting the "level" by determining the bit numbers necessary for an expression in accordance with a quantization step size (second process); and discriminating the coded data transmitted from the second process by a data length of the run and level to thereafter decode the same (third process).

In accordance with another aspect of the present invention, there is provided a variable length coding/decoding apparatus for encoding/decoding image data, the apparatus comprising the means of: dividing an image data into blocks having predetermined numbers of sampling data, transforming the sampled data to a transform coefficient of frequency region, quantizing and scanning the same in a predetermined direction and calculating a symbol having the "run" and "level" as a pair (first means); coding the symbol data calculated from the first means by Huffman code when the data belongs to a regular region (second means); the "run" in a bit number which can express the run up to a maximum run length when the symbol calculated from the first means belongs to an escape region, and coding and transmitting the "level" by determining the bit numbers necessary for an expression in accordance with a quantization step size (third means); and discriminating the coded data transmitted from the third means by a data length of the run and level to thereafter decode the same (fourth means).

BRIEF DESCRIPTION OF THE DRAWINGS

For fuller understanding of the nature and objects of the invention, reference should be made to the following detailed description taken in conjunction with the accompanying drawings in which:

FIG. 8 is a flow chart of a preferred embodiment of a variable length decoding method in accordance with the present invention.

DETAILED DESCRIPTION OF THE INVENTION

Hereinafter, a preferred embodiment of the present invention will be described in detail with reference to the accompanying drawings.

Figure 1:
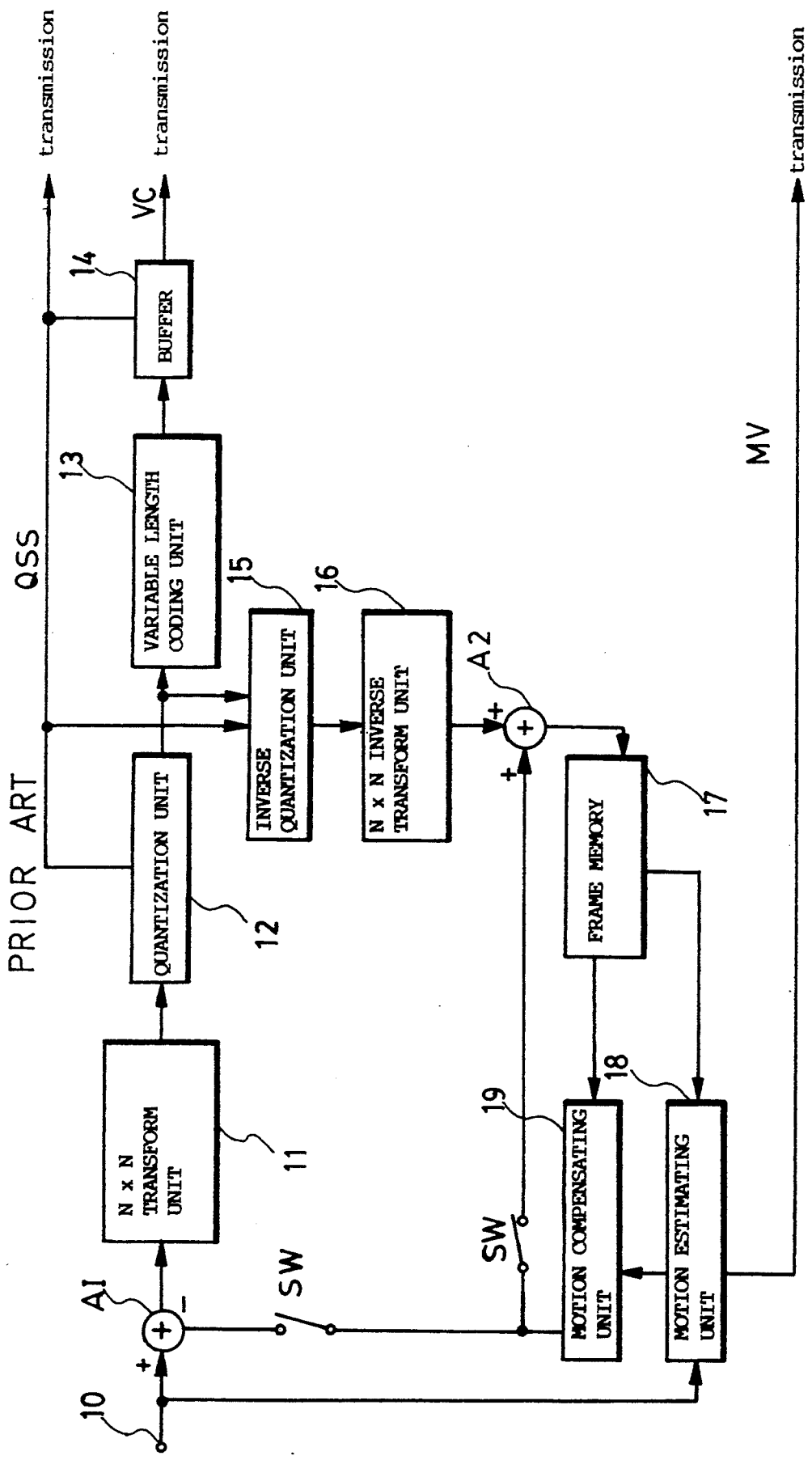
FIG. 1 is a block diagram for illustrating one embodiment of a conventional image data coding apparatus.
Figure 2:
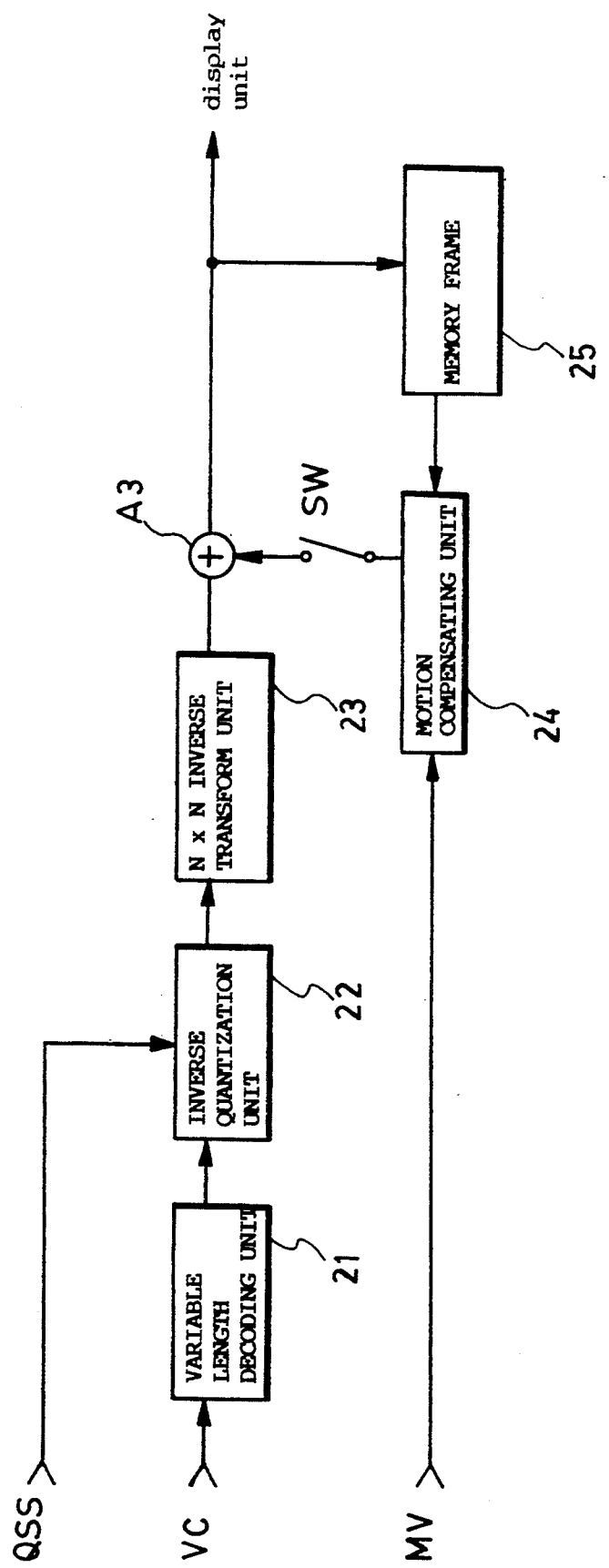
FIG. 2 is a block diagram for illustrating one embodiment of a conventional image data decoding apparatus.
Figure 3:
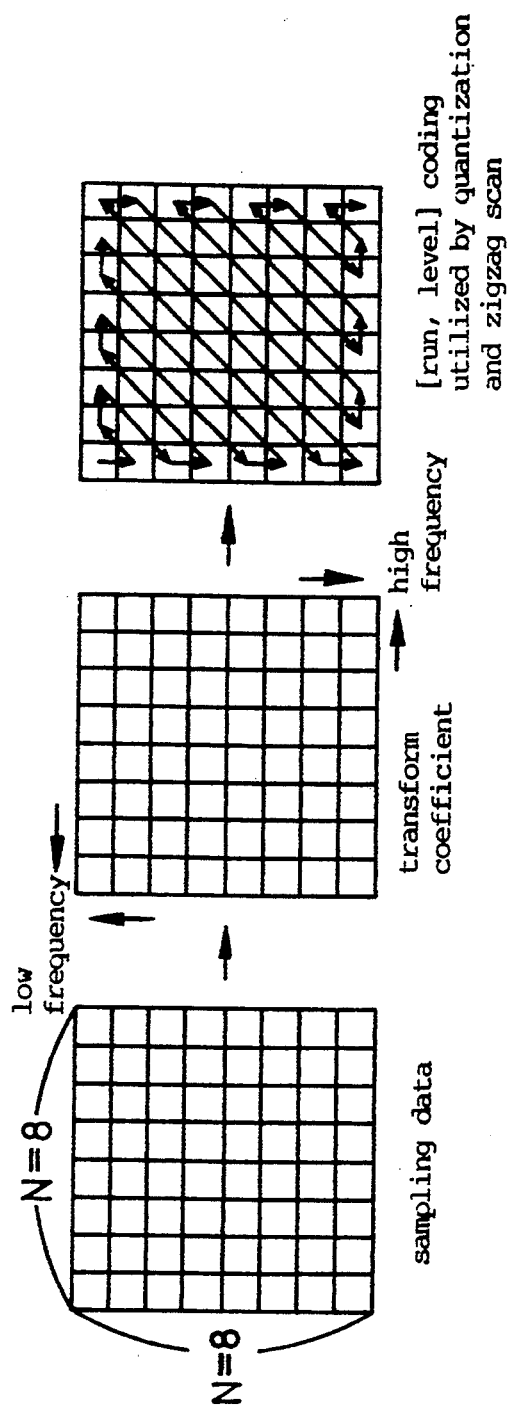
FIGS. 3A-3C are schematic drawings for illustrating a conventional quantization process of the image data.
Figure 4:
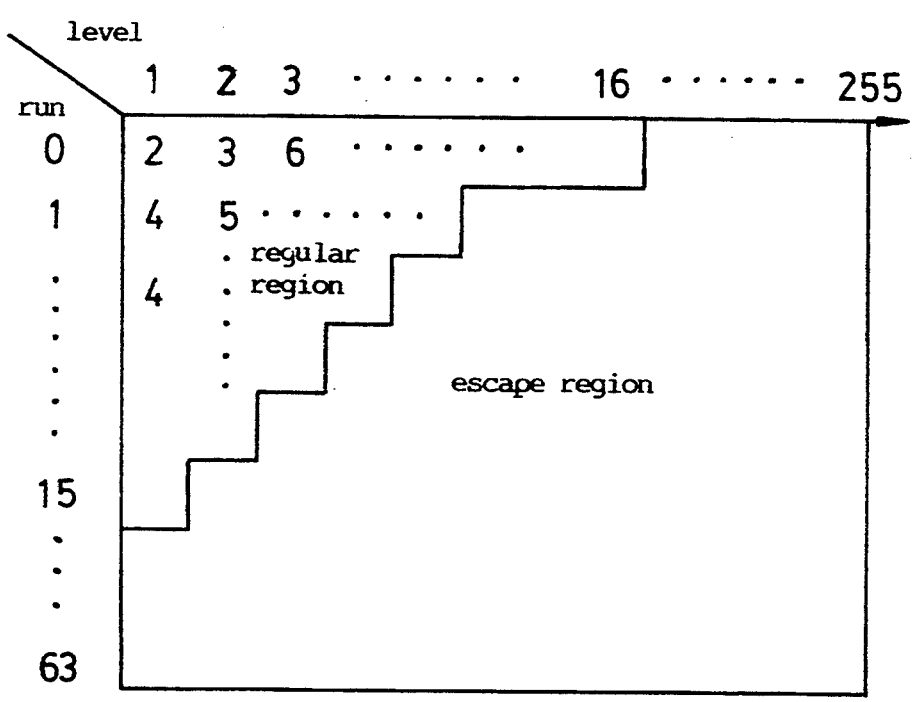
FIG. 4 is a region diagram in accordance with an occurring frequency of a symbol during a conventional two-dimentional Huffman coding.
Figure 5:
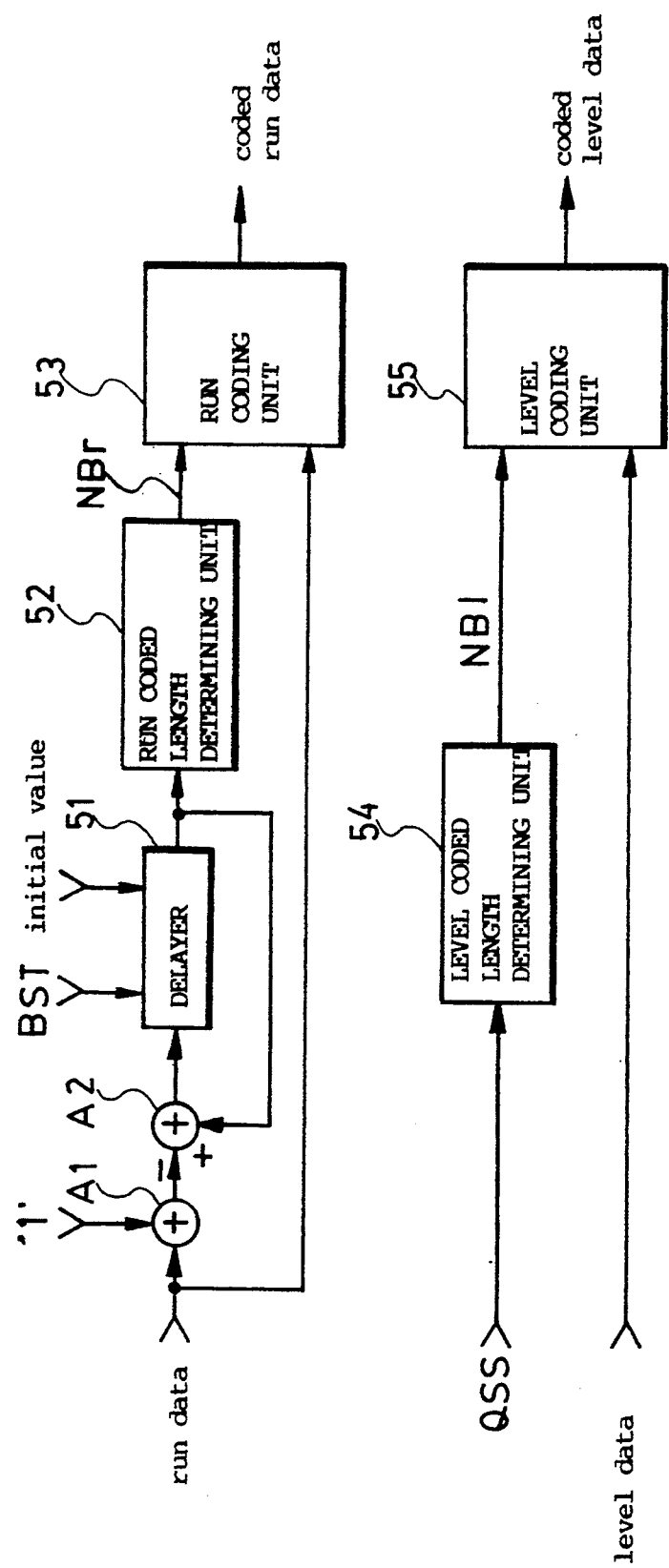
FIG. 5 is a block diagram for illustrating a preferred embodiment of a variable length coding apparatus in accordance with the present invention.

The apparatus in FIG. 5 comprises: a delayer 51 which is loaded with a predetermined value when a variable length coding operation on each block is started, and is supplied with a run value of [run, level] symbol capable of expressing a maximum run length; a run coded length determining unit 52 for determining a bit number NBr necessary for coding data in accordance with the maximum potential run value supplied from the delayer 51; a run coding unit 53 for coding the run data in accordance with the bit number NBr determined by the run coded length determining unit 52; a level coded length determining unit 54 for determining a bit number NB1 necessary for expressing a level value by receiving a quantization step size Qss; and a level coding unit 55 for coding the level data in accordance with the bit number NB1 determined by the level coded length determining unit 54.

When variable length coding is started on each block, a block start signal BST is inputted to the delayer 51 to thereby load an initial value.

For example, in the case of an 8×8 block, "63" is loaded into the delayer 51.

When the [run, level] symbol is applied, the run data and "1" are added together by the first adder A1, and the second adder A2 subtracts the value thereof from the maximum potential run value stored on the delayer 51.

Subsequently, a delayer 51 outputs the decreased new maximum potential run value.

The run coded length determining unit 52 determines the number of bits NBr necessary for coding the run data in accordance with the maximum potential run value supplied from the delayer 51.

Then, the run coding unit 53 codes the run data in a substantially smaller number of bits to thereby output coded run data in accordance with the bit number NBr determined from the run coded length determining unit 52.

Furthermore, the level coded length determining unit 54 determines the number of bits NB1 necessary for expressing the level in accordance with an incoming quantization step size Qss.

In other words, a number of values which a quantization output level can possess can be determined when the maximum potential value of the transform coefficient is divided by the quantization step size, Qss so that the number of bits NB1 necessary for expressing the level can be determined.

Then, the level coding unit codes the level data into a substantially smaller number of bits to thereby output the same in accordance with the number of bits NB1 determined by the level coded length determining unit 54.

For example, an explanation is given below in a case where the run value of the [run, level] symbol supplied to the apparatus of FIG. 5 is "000011" using 6-bits, and the level value is "00001010" of 8-bit.

First, a run value of "000011" is added with "1" at the first adder A1 to thereby be supplied to the second adder A2, and the second adder A2 subtracts an input run value from the current maximum potential run value.

A result thereof is utilized in order to process the subsequent [run, level], and as for the currently-inputted run data, in accordance with the maximum potential run stored in the delayer 51, the run coded length is determined to thereby be run-coded.

In other words, in case of the 8×8 block, because the maximum potential "run" at the initial stage is "63" which is stored in the delayer 51, the run coded length determining unit 52 determines the run coded length NBr to be 6-bits to thereby output the same.

The value "63" is inputted to the adder A2, and "1" is added to the run data to thereby subtract that sum from the value "63" and to input that difference to the delayer 51.

In this way, the maximum potential "run" is decreased, so that the number of bits representing the "run" is decreased.

If the maximum potential run stored on the delayer 51 is assumed as "6" because the "6" can be expressed in 3-bits, then the run coded length determining unit 52 determines the run coded length NBr to be 3-bits and thereby outputs the number of bits NBr as "3".

Then, the run coding unit 53 finally codes "000011" of the run data as "011" to thereby output the same.

Furthermore, if the quantization step size Qss supplied to the level coded length determining unit 54 is relatively a large value and the number of potential quantized values is 50, then 50 quantized values can be expressed in 6-bits, and the level coded length determining unit 54 determines 6-bits as the level coded NB1 to thereby output a value of "6".

Then, the level coded unit 55 finally codes "00001010" of level data as "001010" in 6-bits of level data to thereby output the same.

Accordingly, because the escape sequence run data has a data length from "0-bit" to "6-bit" and the level data has a data length from "0-bit" to "8-bit" the escape sequence adds the escape code data of "6-bit", the run data from "0-bit" to "6-bit", the level data from "0-bit" to "8-bit" and "1-bit" of sign data to thereby make a variable length of "7-bit" to "21-bit".

In other words, the variable length corresponds to a data length wherein unnecessary leading "0's" are removed from the run data and level data of the escape sequence.

Meanwhile, because a pointer position under a current scan of the coding apparatus automatically corresponds to that of a decoding apparatus, the numbers of bits necessary for expressing the run value can be synchronized even though additional information is not sent.

Furthermore, even in the case of the level, because the quantization step size is transmitted to a decoding apparatus for an inverse quantization, the number of bits necessary for expressing the level can be synchronized by utilizing the quantization step size, so that no additional information is needed.

Figure 6:
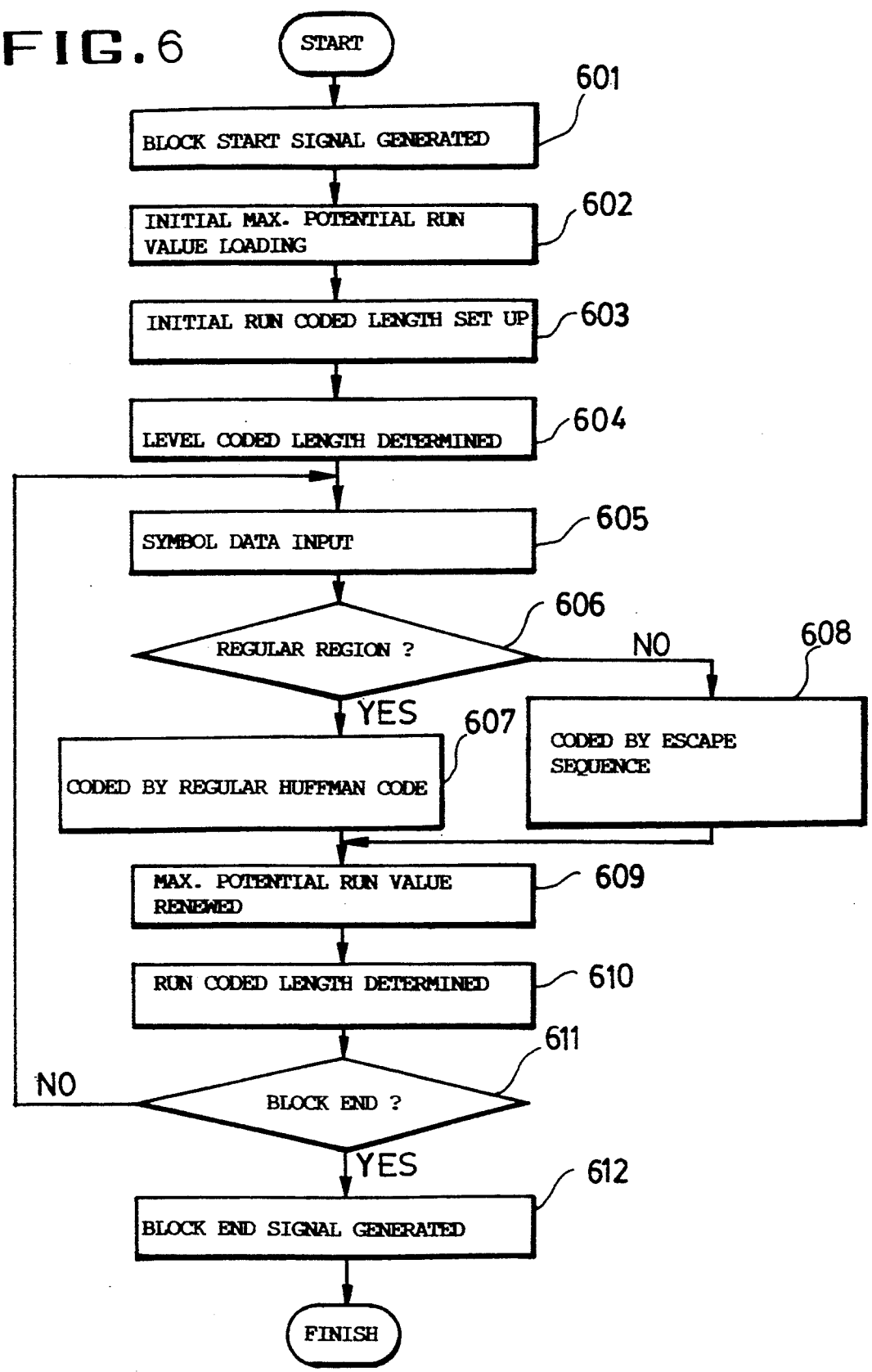
FIG. 6 is a flow chart of one embodiment of a variable length coding method in accordance with the present invention.

FIG. 6 is a flow chart of one embodiment of a variable length coding method in accordance with the present invention.

First of all, when a variable length coding on random block is started, a block start signal BST is generated, step 601, and an initial value is loaded on the delayer, step 602.

The block is scanned and the initial value is set to correspond to a maximum potential run value among the coded run values.

In the present invention, because the block 8×8 is thus having "63" as an initial value, the number of the run coded length is established as "6", step 603, and the level coded length is determined by the quantization step size, step 604.

Then, when a symbol data of [run, level+code] is inputted, step 605, the flow discriminates whether the symbol data belongs to the reqular region, step 606.

If the symbol data belongs to the regular region as a result of the discrimination, a regular Huffman code is allocated in accordance with a probability distribution to thereby be coded, step 607, and if the data does not belong to the regular region, the same is coded by the escape sequence, step 608.

In other words, because the run data and level data are coded in accordance with the run coded length and level coded length determined in the previous step, the escape sequence can be obtained.

Then, the current run data and "1" are subtracted from the current maximum potential run value to thereby calculate a new maximum potential run value, step 609.

The run coded length is determined by the new maximum potential run value, step 610.

The run coded length is utilized for determining a run data length in a coding process of subsequent symbol data.

In this manner, if the coded symbol belongs to the regular region, the symbol is coded by the regular Huffman code to thereby be outputted, and if the symbol belongs to the escape region, the symbol is coded by the escape sequence to thereby be outputted.

Thereinafter, the coded data is discriminated as to whether the same is the end of the block, step 611, and if the data is not the end of the block, next [run, level+-code] symbol data is inputted, step 605, and if the data is the end of the block, a Huffman code corresponding to the end of the block is generated, step 612, and a notice is given that a variable length coding on one block has been finished.

In this way, the run data and level data have variable lengths and subsequently the escape sequence has variable lengths ranging from "7-bit" to "21-bit".

Therefore, in some cases, even in the case of a symbol of the regular region, the coded data length can be markedly shortened by coding of the escape data instead of by a coding of the Huffman code.

Figure 7:
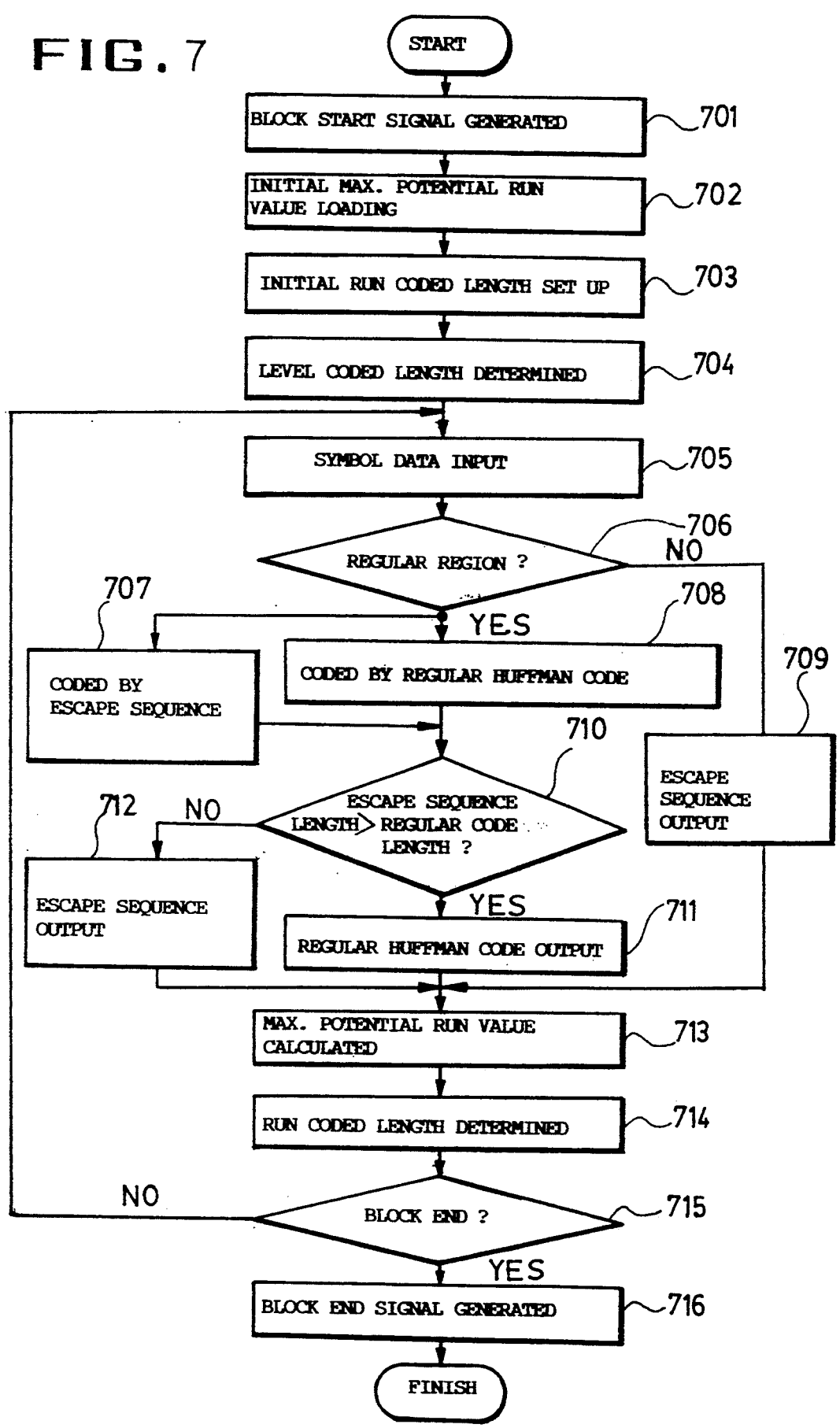
FIG. 7 is a flow chart of another embodiment of an improved variable length coding method in accordance with the present invention.

FIG. 7 shows a process wherein variable length coding is performed on one block in accordance with a variable length coding method thus improved.

A block start signal is generated, step 701, so that an initial maximum potential run value is loaded, step 702.

Then, an initial run coded length (6-bit, as the 8×8 block is presented in the present embodiment to thereby have a maximum potential run of "63") is established, step 703, and according to the quantization step size, the level coded length is determined, step 704.

After a symbol data of [run, level+code] is inputted, step 705, a step leading to a discrimination step as to whether the inputted symbol data belongs to the regular region is identical to the example indicated in FIG. 6.

If the discrimination result shows that the symbol data does not belong to the regular region, the run data and level data are coded according to the run coded length and level coded length determined in the preceding steps to thereby output the escape sequence, step 709.

If the discrimination result shows that the symbol belongs to the regular region, the symbol data is coded by the regular Huffmam code, step 708 and at the same time, the escape sequence is coded, step 707.

Then, the length of the resulting Huffman code and the escape length are compared, step 710, and the shorter data length of the two is outputted, steps 711 and 712.

In this manner, the resulting Huffman code or escape data is outputted according to the region where the symbol belongs or to the data length to thereafter calculate the maximum potential run value, step 713, so that the run coded length can be determined, step 714.

Then, a discrimination is made as to whether or not the coded symbol is an end of the block, step 715, and if the symbol is not the end of the block, subsequent symbol data is supplied to thereby perform the aforesaid coded process.

If the symbol is the end of the block, a Huffman code corresponding to the block end signal is generated, step 716.

FIG. 8 is a flow chart for explaining a preferred embodiment of the variable length decoding method in accordance with the present invention.

First of all, when decoding is started on a block, a block start signal is generated, step 801, so that an initial maximum potential run value is loaded, step 802.

Furthermore, the run coded length is set at 6-bit as an initial value, step 803, and the level coded length is determined according to the quantization step size transmitted from the coding apparatus, step 804.

Then, when the coded data is inputted from the coding apparatus, step 805, the coded data is checked as to whether the data is the escape sequence, step 806.

If the checked result shows that the coded data is the escape sequence, a decoding process is performed on the escape sequence, step 807.

In other words, after the respective number of bits of the run data and level data are determined according to the run coded length and level coded length determined in the preceding steps, the escape data is classified to fit to a respective data number of bits and is thereby interpreted as the run data and level data, so that a decoding can be realized.

Meanwhile, if the discrimination result shows that the coded data is the regular Huffman code, the regular Huffman code is decoded, step 808.

After the decoded symbol data is outputted in this way, step 809, the decoded run data and "1" are subtracted from the current maximum potential run value, so that a new maximum potential run value can be calculated, step 810.

According to the calculated maximum potential run value, the new run coded length is determined, step 811, and the run coded length is utilized in the decoding process of next coded data.

A discrimination is made as to whether the currently decoded symbol data is an end of the block, step 812, and if not a decoding process identical to the one explained in the aforesaid is again performed by receiving the coded data transmitted from the coding apparatus. If the symbol data is the end of the block, a block end signal is generated, notifying a decoding process that one block has been finished, step 813.

As mentioned in the foregoing, a series of coding and decoding methods have been described here in terms of two-dimentional data, however the coding and decoding methods having one-dimensional data or data having 2 levels "0" and "1" can be applied as well, so that the length of the escape sequence to be coded can be variable.

As seen from the aforesaid, the variable length coding and decoding methods and apparatuses in accordance with the present invention can be characterized in that adaptively different coding and decoding methods can be performed in accordance with the frequency of occurrence of quantized symbol data to thereby compress the data. The length of run data and level data of the data coded at the escape sequence can be variably controlled to thereby be coded, and the transmitted data can be substantially compressed by receiving the coded data to thereby decode in the same manner.

The foregoing description and drawings are illustrative and are not to be taken as limiting. Still other variations and modifications are possible without departing from the spirit and scope of the present invention.

What is claimed is:

1. A method of variable length coding of image data, the method comprising the steps of:

dividing the image data into a plurality of blocks, each said block formed of $N \times N$ pixels, wherein N is an integer;

transforming each said block to obtain transform coefficients of each said block;

quantizing said transform coefficients of each said block;

scanning said quantized transform coefficients in a predetermined pattern within each said block to arrange the quantized transform coefficients into a one-dimensional sequence of transform coefficients;

converting said one-dimensional sequence into symbol data having a run component and a level component;

determining a potential maximum run value;

(1) determining whether said symbol data is found within a regular region or an escape region;

(2) assigning a Huffman code to said symbol data if said symbol data is within said regular region and outputting said Huffman code of said symbol;

(3) if said symbol data is within said escape region,
   a) determining an escape code number of bits necessary to represent said potential maximum run value;
   b) assigning a run code having the escape code number of bits to the run component of said symbol data and outputting said assigned run code of said run length;
   c) decrementing said maximum run potential value by a value equal to said run component plus one;
   d) determining a number of level bits based upon a quantization step size value;
   e) assigning a code to said level component using said number of determined level bits and outputting said assigned level code of said level component;

(4) determining if an end of the block has been reached, and asserting an end of block signal if the end of the block has been determined; and if the end of the block has not been reached, repeating steps (1)-(4).

2. A method of variable length coding of image data as recited in claim 1 wherein, said potential maximum run value is equal to $N^2-1$ for the $N \times N$ block.

3. A method of variable length coding of image data, the method comprising the steps of:

dividing the image data into a plurality of blocks, each said block formed of $N \times N$ pixels, wherein N is an integer;

transforming each said block to obtain transform coefficients of each said block;

quantizing said transform coefficients of each said block;

scanning said quantized transform coefficients in a predetermined pattern within each said block to arrange the quantized transform coefficients into a one-dimensional sequence of transform coefficients;

converting said one dimensional sequence into symbol data having a run component and a level component;

determining a potential maximum run value;

(1) determining whether said symbol data is found within a regular region or an escape region;

(2) if said symbol data is found in the regular region, assigning a Huffman code to said symbol data, (3) if said symbol data is found in the regular region,
   a) determining an escape code number of bits necessary to represent said potential maximum run value;
   b) assigning a run code having the escape code number of bits to the run component of said symbol data;
   c) decrementing said potential maximum run value by a value equal to said run component plus one;
   d) determining a number of level bits based upon a quantization step size value;
   e) assigning a code using said number of determined level bits to said level component;
   f) outputting said assigned Huffman code if a number of bits of said assigned Huffman code is less than a number of bits of said escape codes of said run length and level codes together;
   g) outputting said escape codes of said run length and level codes together if the number of bits of said escape code of said run length and level codes together is less than the length of the assigned Huffman code;

(4) if said symbol data is within said escape region,
   a) determining an escape code number of bits necessary to represent said potential maximum run value;
   b) assigning a run code having the escape code number of bits to the run component of said symbol data and outputting said assigned run code of said run length;
   c) decrementing said maximum run potential value by a value equal to said run component plus one;
   d) determining a number of level bits based upon a quantization step size value;
   e) assigning a code using said number of determined level bits to said level component and outputting said assigned level code of said level component;

(5) determining if an end of the block has been reached, and asserting an end of block signal if the end of the block has been reached; and if the end of the block has not been reached, then repeating steps (1)–(5).

4. A method of variable length coding of image data as recited in claim 3 wherein, said potential maximum run value is equal to $N^2-1$ for the N×N block.

5. An apparatus for variable length coding of image data, the apparatus comprising:

first means for dividing the image data into a plurality of blocks, each said block formed of N×N pixels, wherein N is an integer;

second means for transforming each said block to obtain transform coefficients of each said block;

third means for quantizing said transform coefficients of each said block;

fourth means for scanning said quantized transform coefficients in a predetermined pattern within each said block to arrange the quantized transform coefficients into a one-dimensional sequence of transform coefficients;

fifth means for converting said one dimensional sequence into symbol data having a run component and a level component;

sixth means for determining a potential maximum run value;

seventh means for determining whether said symbol data is found within a regular region or an escape region, assigning a Huffman code to said symbol data if said symbol data is within said regular region and outputting said Huffman code of said symbol;

eighth means for determining an escape code number of bits necessary to represent said potential maximum run value, assigning a run code having the escape code number of bits to the run component of said symbol data and outputting said assigned run code of said run length, and decrementing said potential maximum run value by a value equal to said run component plus one;

ninth means for determining a number of level bits based upon a quantization step size value, assigning a code to said level component using said number of determined level bits and outputting said assigned level code of said level component;

tenth means for determining if an end of the block has been reached, and for outputting an end of block signal.

6. An apparatus for variable length coding of image data as recited in claim 5, wherein said sixth means determines that said potential maximum run value is $N^2-1$ for an N×N block.

7. An apparatus for variable length coding of image data as recited in claim 5, wherein said eighth means comprises:

a delaying means for loading, storing and outputting the potential maximum run value when coding on the block is started;

a subtracting means for subtracting from the potential maximum run value a value of a run length plus one;

a run coding length determining means for determining a run coded length, which is a number of bits necessary for expressing the potential maximum run value supplied from the delaying means;

a run coding means for coding the run data in accordance with the run coded length determined by the run coding length determining means;

a level coding length determining means for determining a level coded length, which is a number of bits necessary for expressing a quantized value calculated according to a quantization step size; and a level coding means for coding the level data in accordance with the level coded length determined by the level coding length determining means.

* * * * *